United States Patent [19]

Kuo

[11] 4,417,154

[45] Nov. 22, 1983

[54] CIRCUIT FOR APPLYING A HIGH VOLTAGE SIGNAL TO A FUSIBLE LINK

[75] Inventor: Clinton C. K. Kuo, Austin, Tex.

[73] Assignee: Motorola, Inc., Schaumburg, Ill.

[21] Appl. No.: 346,974

[22] Filed: Feb. 8, 1982

[51] Int. Cl.[3] .............................................. G11C 17/00
[52] U.S. Cl. .................... 307/202.1; 365/96; 365/200
[58] Field of Search ................ 307/202.1; 365/96, 200

[56] References Cited

U.S. PATENT DOCUMENTS

| | | | |
|---|---|---|---|
| 4,122,547 | 10/1978 | Schroeder et al. | 365/96 X |
| 4,199,726 | 4/1980 | Bukosky et al. | 307/202.1 |
| 4,358,833 | 11/1982 | Folmsbee et al. | 365/200 |

Primary Examiner—John S. Heyman
Attorney, Agent, or Firm—Anthony J. Sarli, Jr.; Jeffrey Van Myers; James L. Clingan, Jr.

[57] ABSTRACT

A fusible link is selectively opened by selectively applying a high voltage signal to a transistor in series with the fusible link while the high voltage signal is applied to the fusible link. A grounding circuit ensures that one terminal of the fusible link is coupled to ground in the absence of the high voltage signal. The grounding circuit can be used in conjunction with a plurality of means for selectively opening fusible links.

7 Claims, 2 Drawing Figures ic threshold voltage of $-2.0$ to $-3.0$ volts.

CIRCUIT FOR APPLYING A HIGH VOLTAGE SIGNAL TO A FUSIBLE LINK

TECHNICAL FIELD

This invention relates to integrated circuits having fusible links, and more particularly to circuits for applying a high voltage signal to fusible links.

BACKGROUND ART

It is becoming more common to use polysilicon fuses in integrated circuits for permanent selection purposes. One use is for permanently replacing a row or column of a memory which has a defective memory element with a redundant row or column. Another use is in array division of a memory in which major portions of the memory array are permanently deselected. In integrated circuit technology the polysilicon fuses are typically selectively opened by having a control transistor act as a switch in series with the polysilicon fuse. A voltage is applied to the polysilicon fuse and if the fuse is to be opened, the transistor is turned on to provide a current path so that current will flow through the fuse. The current must, of course, be sufficient to open the fuse.

The limitations on the current for a given polysilicon fuse are the magnitude of the applied voltage and the current carrying capability of the transistor. For a given transistor its current carrying capability is increased by applying a higher voltage on its control electrode. Techniques exist for doing this. Another technique has been to apply a high voltage signal to the fuse. Each of these techniques has been used separately but not together. In "Equipping a line of memories with spare cells," by Robert Abbot, Kin Kokkonen, Roger I. Kung, and Ronald J. Smith, *Electronics*, July 28, 1981, pp. 127–130, each technique is used. FIG. 1.a on page 128 shows a high voltage coupled to the control electrode of the series transistor. FIG. 2.b on page 129 shows a high voltage coupled to the control electrode of the series transistor.

BRIEF SUMMARY OF THE INVENTION

An object of the invention is to provide an improved circuit for applying a high voltage signal to a fusible link.

Another object of the invention is to provide a high voltage signal to both a fusible link and a control electrode of a transistor in series with the fusible link.

Yet another object of the invention is to couple a common terminal for receiving a high voltage signal to both a fusible link and a control electrode of a transistor in series with the fusible link.

The above and other objects of the present invention are achieved by a transistor in series with a fusible link. The fusible link has a first terminal for receiving a high voltage signal, and a second terminal. The transistor has a first current electrode coupled to the second terminal of the fusible link, a second current electrode coupled to a first power supply terminal, and a control electrode. A selection circuit selectively couples the first terminal of the fusible link to the control electrode of the transistor. A load device has a first terminal coupled to a second power supply terminal, and a second terminal coupled to the first current electrode of the transistor. A coupling circuit couples the first terminal of the fusible link to the first power supply terminal in response to the high voltage signal being absent.

DESCRIPTION OF A PREFERRED EMBODIMENT

Figure 1:
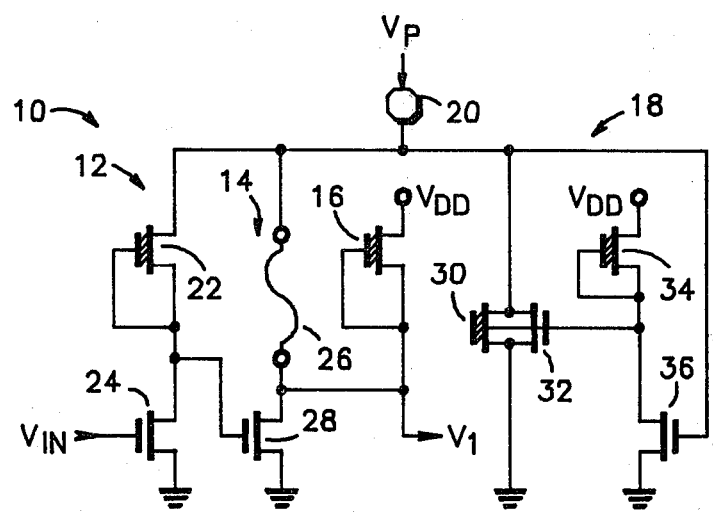
FIG. 1 is a circuit diagram of a preferred embodiment of the invention.
Figure 2:
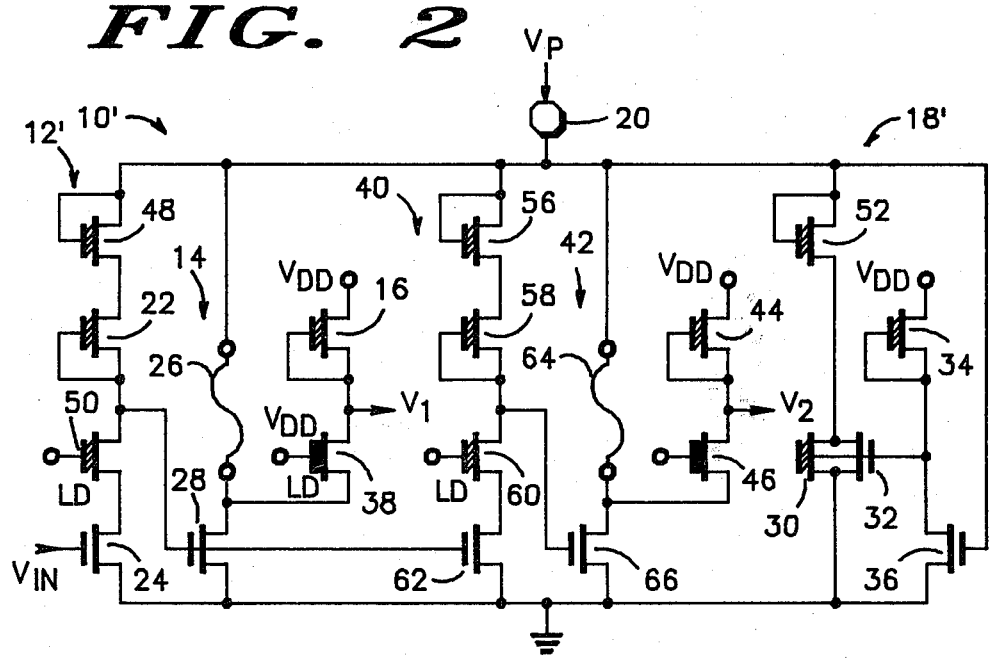
FIG. 2 is a circuit diagram of the preferred embodiment of FIG. 1 in a modified form.

Shown in FIG. 1 is a fuse circuit 10 according to a preferred embodiment of the invention comprised generally of a selection circuit 12, a fuse control circuit 14, a transistor 16, a grounding circuit 18, and a terminal 20 for receiving a high voltage signal $V_p$ which can be, for example, 5–15 volts. The circuits of FIGS. 1 and 2 are depicted using conventional N channel unsulated gate field effect transistors of one of four types; enhancement transistors with a characteristic threshold voltage of 0.4 to 0.8 volt, natural transistors with a characteristic threshold voltage of 0.0 to 0.4 volt, depletion transistors with a characteristic threshold voltage of $-3.0$ to $-4.0$ volts, and light depletion transistors with a characteristic threshold voltage of $-2.0$ to $-3.0$ volts.

Selection circuit 12 comprises a depletion transistor 22 and an enhancement transistor 24. Transistor 22 has a drain connected to terminal 20, and a gate and source connected together. Transistor 24 has a gate for receiving an input signal $V_{IN}$, a source connected to a negative power supply shown as ground, and a drain connected to the gate and source of transistor 22 forming an output terminal of selection circuit 12.

Fuse control circuit 14 comprises a polysilicon fuse 26 and an enhancement transistor 28. Fuse 26 has a first terminal connected to terminal 20, and a second terminal. Transistor 28 has a gate connected to the output terminal of selection circuit 12, a source connected to ground, and a drain connected to the second terminal of fuse 26 forming an output terminal of fuse control circuit 14.

Transistor 16 is a depletion transistor which has a drain connected to a positive power supply $V_{DD}$ which can be, for example, 5 volts, and a gate and a source connected together for providing an output signal $V_1$ of fuse circuit 10. The gate and source of transistor 16 are connected to the output terminal of fuse control circuit 14.

Grounding circuit 18 comprises a depletion transistor 30, an enhancement transistor 32, a depletion transistor 34, and an enhancement transistor 36. Transistor 34 has a drain connected to $V_{DD}$, and a gate and a source connected together. Transistor 36 has a drain connected to the source and gate of transistor 34, a gate connected to terminal 20, and a source connected to ground. Transistors 30 and 32 each have a gate connected to the drain of transistor 36, a drain connected to terminal 20, and a source connected to ground.

The desired operation is that when $V_p$ is present at terminal 20, fuse 26 will be opened in response to input signal $V_{IN}$ being a logic low, for example, ground, but will not be opened if input signal $V_{IN}$ is a logic high, for example, 5 volts. If fuse 26 is opened, output signal $V_1$ will be a logic high, whereas if fuse 26 is not opened, output signal $V_1$ will be a logic low.

In order to open fuse 26, $V_p$ must be applied to terminal 20 and input signal $V_{IN}$ must be a logic low. With input $V_{IN}$ at a logic low, transistor 24 is off so that $V_p$ is coupled to the gate of transistor 28 through transistor 22. Transistor 22 acts as a load device. Transistor 28 is turned on by $V_p$ being on its gate, allowing current to flow through fuse 26. Transistor 28 is chosen by conventional means so that with $V_p$ on its gate, it will cause essentially no voltage drop from drain to source. Consequently essentially the entire voltage $V_p$ is across fuse 26 maximizing the current therethrough so that it will be opened more quickly and reliably. If input signal $V_{IN}$ is a logic high, transistor 24 will be on so that the output terminal of selection circuit 12 will be at essentially ground and thereby turning off transistor 28. With transistor 28 off, it will not provide a current path for fuse 26 so that fuse 26 will not be opened upon application of $V_p$ at terminal 20.

Upon removal of $V_p$, terminal 20 is coupled to ground by grounding circuit 18. There is some capacitance associated with terminal 20 so that terminal 20 will remain charged to some positive voltage unless some means for discharging is provided. Transistor 30 provides a relatively small but continuous current path to ground which discharges the capacitance of terminal 20 until the voltage at terminal 20 drops below the threshold voltage of transistor 36, turning transistor 36 off. With transistor 36 off, $V_{DD}$ is coupled to the gate of transistor 32 as well as transistor 30 through transistor 34. Transistor 34 acts as a load device. With $V_{DD}$ on the gates of transistors 30 and 32, transistor 32 turns on and transistor 30 also increases its conductivity so that terminal 20 is coupled solidly to ground through transistors 30 and 32. It is necessary that terminal 20 be coupled to ground when fuse 26 is not open because when fuse 26 is not open, output signal $V_1$ must be a logic low. Because current passes through transistor 16 and fuse 26 to terminal 20, terminal 20 must be at essentially ground to ensure output signal $V_1$ is a logic low. It is necessary that terminal 20 be coupled to ground when fuse 26 is open, because when fuse 26 is open, output signal $V_1$ must be a logic high. If terminal 20 was charged to a positive voltage with transistor 24 off, the positive voltage would be coupled to the gate of transistor 28, turning transistor 28 on and reducing the voltage of output signal $V_1$. Transistor 16 acts as a load device and has a small size ratio (channel width to channel length ratio) for limiting the current which passes through fuse 26 when output signal $V_1$ is a logic low. Transistor 30 has a size ratio chosen by conventional means to be sufficiently larger than the size ratio of transistor 16 to ensure that the voltage on terminal 20 is reduced below the threshold voltage of transistor 36 subsequent to removal of $V_p$ in the case when fuse 26 is not opened.

Shown in FIG. 2 is a modified fuse circuit 10' which is a modified form of fuse circuit 10 of FIG. 1, comprised generally of a terminal 20, a modified input circuit 12', fuse control circuit 14, transistor 16, a natural transistor 38, a selection circuit 40, a fuse control circuit 42, a depletion transistor 44, a natural transistor 46, and a modified grounding circuit 18'.

Modified input circuit 12' has an additional depletion transistor 48 and an additional light depletion transistor 50. Transistor 48 is interposed between the drain of transistor 22 and terminal 20 for current limiting purposes. Transistor 28 has a gate and drain connected to terminal 20, and a source connected to the drain of transistor 22. Transistor 50 is interposed between transistor 22 and transistor 24 for voltage blocking purposes to protect transistor 24. Transistor 50 has a gate connected to $V_{DD}$, a source connected to the drain of transistor 24, and a drain connected to the gate and source of transistor 22 to form the output terminal of modified selection circuit 12'. Functional operation of modified selection circuit 12' remains the same as that of selection circuit 12 of FIG. 2.

Transistor 38 is interposed between the output terminal of fuse circuit 14 and transistor 16 to prevent current flowing from terminal 20 to $V_{DD}$ through fuse 26 and transistor 16 when $V_{pp}$ is present at terminal 20 and transistor 28 is off. Transistor 38 has a gate connected to $V_{DD}$, a first current electrode connected to the output terminal of fuse control circuit 14, and a second current electrode connected to the gate and source of tranistor 16 to form a first output terminal of modified fuse circuit 10' for providing output signal $V_1$ as in FIG. 1.

Modified grounding circuit 18' has an additional depletion transistor 52. Transistor 52 is interposed between terminal 20 and the drains of transistors 30 and 32.

Selection circuit 40 comprises depletion transistors 56 and 58, a light depletion transistor 60, and an enhancement transistor 62. Transistor 56 has a gate and a drain connected to terminal 20, and a source. Transistor 58 has a drain connected to the source of transistor 56, and a gate and source connected together. Transistor 60 has a drain connected to the source and gate of transistor 58 to form an output terminal of selection circuit 40, a gate connected to $V_{DD}$, and a source. Transistor 62 has a drain connected to the source of transistor 60, a source connected to ground and a gate as an input of selection circuit 40 connected to the output terminal of modified selection circuit 12'.

Fuse control circuit 42 comprises a polysilicon fuse 64 and an enhancement transistor 66. Fuse 42 has a first terminal connected to terminal 20, and a second terminal. Transistor 66 has a drain connected to the second terminal of fuse 42 to form an output terminal of fuse control circuit 42, a gate connected to the output terminal of selection circuit 40. Transistor 46 has a gate connected to $V_{DD}$, a source connected to the output terminal of fuse control circuit 42, and a drain. Transistor 44 has a drain connected to $V_{DD}$, and a source and a gate connected to the drain of transistor 46 to form a second output terminal of modified fuse circuit 10' for providing a second output signal $V_2$ of modified fuse circuit 10'.

Selection circuit 40, fuse control circuit 42, transistor 46, and transistor 44 cooperate together to provide output signal $V_2$ in response to an input signal received at the gate of transistor 62 in the same manner as modified selection circuit 12', fuse control circuit 14, transistor 38, and transistor 16 cooperate together to provide output signal $V_1$ in response to input signal $V_{IN}$. Additional selection and fuse control circuits circuits could also be added with only one required grounding circuit 18 or modified grounding circuit 18'. With added selection and fuse control circuits, there will also be added transistors analogous to transistor 16 which may supply current into terminal 20. Consequently, the size ratio of transistor 30 must be increased to ensure that the voltage on terminal 20 will be reduced below the threshold voltage of transistor 36 when $V_p$ is removed.

In fuse circuit 10' the input of selection circuit 40 is coupled to the output terminal of modified selection circuit 12'. Accordingly when $V_p$ is applied, if $V_{IN}$ is a logic low, fuse 26 will be opened, whereas if $V_{IN}$ is a logic high, fuse 64 will be opened. Consequently there are four possible output signal configurations: if $V_p$ is not applied, output signals $V_1$ and $V_2$ will both be a logic low; if $V_p$ is applied while $V_{IN}$ is a logic high, $V_1$ will be a logic low and $V_2$ will be a logic high; if $V_p$ is applied while $V_{IN}$ is a logic low; $V_I$ will be a logic high and $V_2$ will be a logic low; and if $V_p$ is applied while $V_{IN}$ alternates between a logic high and a logic low, $V_I$ and $V_2$ will both be a logic high.

While the invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

I claim:

1. A circuit for applying a high voltage signal to a fusible link, comprising:
   a first transistor having a first current electrode coupled to a first power supply terminal, a second current electrode for providing an output signal, and a control electrode;
   a fusible link having a first terminal coupled to a high voltage terminal for receiving the high voltage signal and a second terminal coupled to the second current electrode of the first transistor;
   selection means for selectively coupling the high voltage terminal to the control electrode of the first transistor;
   a load device having a first terminal coupled to a second power supply terminal, and a second terminal coupled to the second current electrode of the first transistor; and
   coupling means directly connected to the high voltage terminal for coupling the high voltage terminal to the first power supply terminal in response to the high voltage signal being absent from the high voltage terminal;
   whereby in the absence of the high voltage signal, the output signal is provided via the fusible link at a voltage present at the first power supply terminal when the fusible link has not been opened; and the output signal is provided via the load device at a voltage present at the second power supply terminal when the fusible link has been opened.

2. A circuit for applying a high voltage signal to a fusible link, comprising:
   a first transistor having a first current electrode coupled to a first power supply terminal, a second current electrode, and a control electrode;
   a fusible link having a first terminal for receiving the high voltage signal and a second terminal coupled to the second current electrode of the first transistor;
   selection means for selectively coupling the first terminal of the fusible link to the control electrode of the first transistor;
   a load device having a first terminal coupled to a second power supply terminal, and a second terminal coupled to the second current electrode of the first transistor;
   resistive means for providing a first current path between the first terminal of the fusible link and the first power supply terminal;
   detection means for providing a detection signal when a voltage at the first terminal of the fusible link is lower than a predetermined voltage; and
   switching means for providing a second current path between the first terminal of the fusible link and the first power supply terminal in response to to the detection signal, said second current path being substantially more conductive than the first current path.

3. The circuit of claim 2 wherein:
   the resistive means comprises a second transistor having a gate coupled for receiving the detection signal, a first current electrode coupled to the first terminal of the fusible link, and a second current electrode coupled to the first power supply terminal;
   the detection means comprises a third transistor and a fourth transistor, said third transistor having a first current electrode coupled to the second power supply terminal, and a control electrode and a second current electrode coupled together, and said fourth transistor having a control electrode coupled to the first terminal of the fusible link, a first current electrode coupled to the first power supply terminal, and a second current electrode coupled to the gate and second current electrode of the third transistor for providing the detection signal; and
   the switching means comprises a fifth transistor having a first current electrode coupled to the first terminal of the fusible link, a second current electrode coupled to the first power supply terminal, and a control electrode coupled for receiving the detection signal.

4. The circuit of claim 3 further comprising a blocking transistor interposed between the second terminal of the load device and the second current electrode of the first transistor, said blocking transistor having a first current electrode coupled to the second terminal of the load device, a second current electrode coupled to the second current electrode of the first transistor, and a control electrode coupled to the second power supply terminal.

5. A circuit for applying a high voltage signal to a plurality of fusible links, comprising:
   a plurality of fuse opening means, coupled between a first power supply terminal and a high voltage terminal for receiving a high voltage signal, each fuse opening means for applying a high voltage signal across a fusible link in response to a signal received on an input of each of the fuse opening means while the high voltage signal is present at the high voltage terminal; and
   coupling means directly connected to the high voltage terminal for coupling the high voltage terminal to the first power supply terminal in response to to the high voltage signal being absent.

6. A circuit for applying a high voltage signal to a plurality of fusible links, comprising:
   a plurality of fuse opening means, coupled between a first power supply terminal and a high voltage terminal for receiving a high voltage signal, each fuse opening means for applying a high voltage signal across a fusible link in response to a signal received on an input of each of the fuse opening means while the high voltage signal is present at the high voltage terminal;
   resistive means for providing a first current path between the high voltage terminal and the first power supply terminal;

detection means for providing a detection signal when a voltage at the high voltage terminal is lower than a predetermined voltage; and switching means for providing a second current path between the high voltage terminal and the first power supply terminal in response to the detection signal, said second current path being substantially more conductive than the first current path.

7. The circuit of claim 6 wherein:

the resistive means comprises a first transistor having a gate coupled for receiving the detection signal, a first current electrode coupled to the high voltage signal terminal, and a second current electrode coupled to the first power supply terminal;

the detection means comprises a second transistor and a third transistor, said second transistor having a first current electrode coupled to a second power supply terminal, and a control electrode and a second current electrode coupled together, and said third transistor having a control electrode coupled to the high voltage signal terminal, a first current electrode coupled to the first power supply terminal, and a second current electrode coupled to the gate and second current electrode of the second transistor for providing the detection signal; and the switching means comprises a fourth transistor having a first current electrode coupled to the high voltage signal terminal, a second current electrode coupled to the first power supply terminal, and a control electrode coupled for receiving the detection signal.

* * * * *

UNITED STATES PATENT AND TRADEMARK OFFICE
CERTIFICATE OF CORRECTION

PATENT NO. : 4,417,154

DATED : 11/22/83

INVENTOR(S) : Clinton C.K. Kuo

It is certified that error appears in the above-identified patent and that said Letters Patent are hereby corrected as shown below:

Column 6, line 3, change "to to" to --to--.

Column 6, line 53, change "to to" to --to--.

Signed and Sealed this

Fourteenth Day of February 1984

[SEAL]

Attest:

Attesting Officer

GERALD J. MOSSINGHOFF

Commissioner of Patents and Trademarks